(12) United States Patent
Hsu et al.

(10) Patent No.: US 7,057,913 B2
(45) Date of Patent: Jun. 6, 2006

(54) LOW-POWER SEARCH LINE CIRCUIT ENCODING TECHNIQUE FOR CONTENT ADDRESSABLE MEMORIES

(75) Inventors: Steven K. Hsu, Lake Oswego, OR (US); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 78 days.

(21) Appl. No.: 10/817,941

(22) Filed: Apr. 6, 2004

(65) Prior Publication Data

US 2005/0219887 A1    Oct. 6, 2005

(51) Int. Cl.
*G11C 15/00* (2006.01)

(52) U.S. Cl. .............. 365/49; 365/189.06; 365/189.07; 365/230.06; 365/233

(58) Field of Classification Search .................. 365/49, 365/189.06, 189.07, 230.06, 233, 185.23
See application file for complete search history.

(56) References Cited

U.S. PATENT DOCUMENTS

| | | | | | |
|---|---|---|---|---|---|
| 5,289,403 | A | * | 2/1994 | Yetter | 365/49 |
| 6,535,410 | B1 | * | 3/2003 | Yanagawa | 365/49 |
| 6,845,025 | B1 | * | 1/2005 | Nataraj | 365/49 |

* cited by examiner

*Primary Examiner*—Richard Elms
*Assistant Examiner*—Pho M. Luu
(74) *Attorney, Agent, or Firm*—Fleshner & Kim LLP

(57) ABSTRACT

A circuit for searching a content addressable memory includes a driver which generates a plurality of search line values, different combinations of which are used to implement a one-hot encoding scheme for searching the memory. Two or more cells in the memory may be consecutive bit positions of a word, and the driver may be synchronously operated to generate the different combinations of values.

24 Claims, 7 Drawing Sheets

LOW-POWER SEARCH LINE CIRCUIT ENCODING TECHNIQUE FOR CONTENT ADDRESSABLE MEMORIES

FIELD

This invention generally relates to memory circuits, and more particularly to a system and method for controlling a content addressable memory.

BACKGROUND OF THE INVENTION

A content addressable memory (CAM) is unique in terms of the way in which it accesses stored data. In more traditional forms of memory, each data item is assigned a specific memory address. This address is then used as a basis for performing all storage and retrieval operations for that item. CAM-type memories, however, take an entirely different approach.

Instead of accessing data by memory address, the value of the data itself determines how it is accessed and in some cases where the data is stored or otherwise indexed. In order to implement this alternative addressing scheme, value-matching logic compares input data to the data stored in each storage location of the memory. An indicator signal is then generated to identify the location(s) where a match (or "hit") exists. Subsequent operations (e.g., read) may then be performed on the data stored at these locations.

Content addressable memories are also known as associative memories and may be used to form the basic components of many circuits including caches, memory management units, and translation look-aside buffers. CAMs are also used in TCP/IP acceleration chips and networking chips to, for example, form look-up tables and support packet forwarding and classification operations in switches and routers.

DETAILED DESCRIPTION

Figure 1:
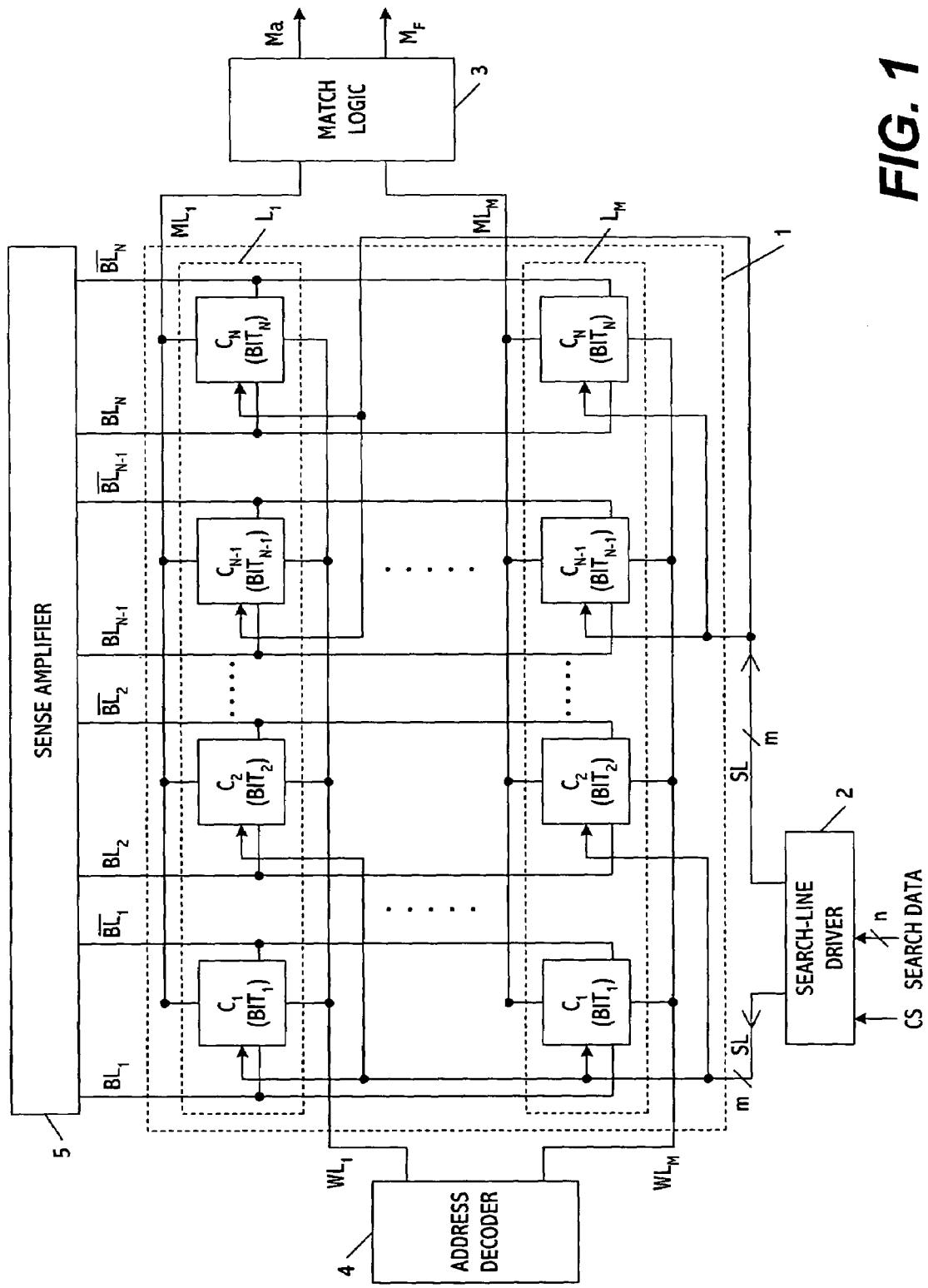
FIG. 1 is a diagram showing a content addressable memory circuit in accordance with one embodiment of the present invention.

FIG. 1 shows a content addressable memory circuit in accordance with one embodiment of the present invention. This circuit includes a CAM array 1, a search line driver 2, and match logic 3. The CAM array includes a plurality of memory locations $L_1$–$L_M$, each of which is formed from a predetermined number of cells $C_1$–$C_N$. Each cell stores one bit of data and thus when taken in combination each memory location stores a data word N bits in length. The values of M and N may be set to any values and are preferably selected to satisfy the storage requirements of an intended application. For illustrative purposes, cells $C_1$ through $C_N$ are labeled bits 1 through N respectively.

The CAM array also includes a plurality of match lines $ML_1$ through $ML_M$, a plurality of word lines $WL_1$–$WL_M$, and a plurality of pairs of differential bit lines $BL_1$ and /$BL_1$ through $BL_N$ and /$BL_N$. Each match line is coupled to the cells in a respective one of the memory locations (cell rows), e.g., match line $ML_1$ is connected to the cells in location $L_1$, match line $ML_2$ is connected to the cells in location $L_2$, and so on. The match lines may be connected to match logic 3 for purposes of generating, for example, a match address Ma and flag F as described in greater detail below.

Each word line is coupled to the cells in a respective one of the memory locations (cell rows), e.g., word line $WL_1$ is connected to the cells in location $L_1$, word line $WL_2$ is connected to the cells in location $L_2$, and so on. The word lines are then coupled to an address decoder 4.

Each pair of differential bit lines is coupled to the same cell numbers (bits) for all memory locations, e.g., bit lines $BL_1$ and /$BL_1$ are connected to $C_1$ in memory locations $L_1$ through $L_M$, bit lines $BL_2$ and /$BL_2$ are connected to $C_2$ in memory locations $L_1$ through $L_M$, and so on. The pairs of bit lines are preferably connected to a sense amplifier circuit 5 for logical voltage correction.

The search line driver converts, or encodes, n bits of search data into a combination of logical values which are simultaneously applied in parallel to the CAM cells. Preferably, but not necessarily, the combination of logical values are synchronously generated by driver 2 based on an input clock signal CS. The logical values are output on a respective number of search lines SL coupled to the cells in the CAM array. For illustrative purposes, m search lines are shown.

In accordance with the present embodiment, the cells in the CAM array are arranged in pairs so that each pair of cells is driven by a different combination of m logical values on the search lines. Put differently, at least two cells (bits) in each memory location (word) are driven by a different combination of search lines of the driver. In FIG. 1, adjacent pairs of cells are driven by different combinations of search lines SL, but non-adjacent cells may be driven in alternative embodiments.

Figure 2A:
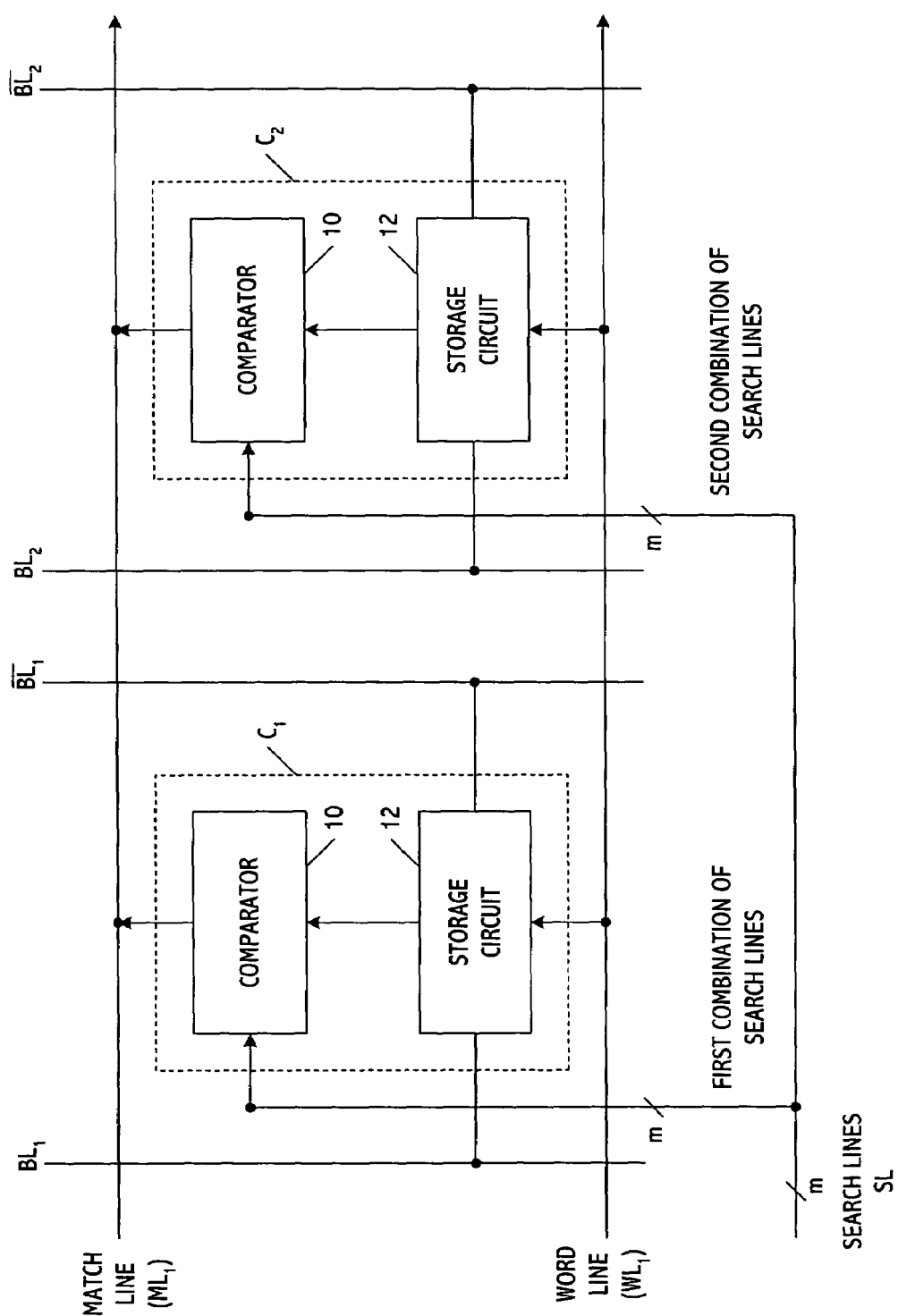
FIG. 2A is a diagram showing an example of the internal structure of the CAM array cells in the circuit of FIG. 1 and how the cells in each row may be driven by a different combination of the same search lines.

FIG. 2A shows an example of the internal structure of the CAM cells and the manner in which pairs of cells in each row may be driven by different combinations of the same search lines. (For illustrative purposes, only cells $C_1$ and $C_2$ are shown). Each cell includes a comparator circuit 10 and a storage circuit 12 for storing at least one data bit. The comparator circuit may be formed from logic (e.g., exclusive OR) that compares a value based on specific combination of search line values with the data in the storage circuit. In the example shown, a first combination of search lines is connected to the comparator of cell $C_1$ and a second combination of search lines is connected to the comparator of cell $C_2$. The storage circuit maybe structured as a RAM-type cell, a keeper circuit, or any other known arrangement capable of storing one or more data bits.

Initially, match line $ML_1$ may be charged to a predetermined voltage. If a match does not occur, the comparator circuit generates a signal for driving the match line to a different voltage, e.g., a reference or ground potential. When this occurs, match logic 3 determines that memory location $L_1$ which includes cells $C_1$ and $C_2$ does not match the input search data. If a match occurs, the comparator circuit will not generate a signal for driving match line $ML_1$ to a different voltage. If a match occurs in all the cells in memory location $L_1$, then $ML_1$ will remain at its charged value and the match logic will determine that the memory address corresponding to $L_1$ matches the input search data. This data stored in circuit 12 is output on bit lines $BL_1$ and $/BL_1$. Similar comparison operations are performed for all memory locations in the CAM array.

Figure 2B:
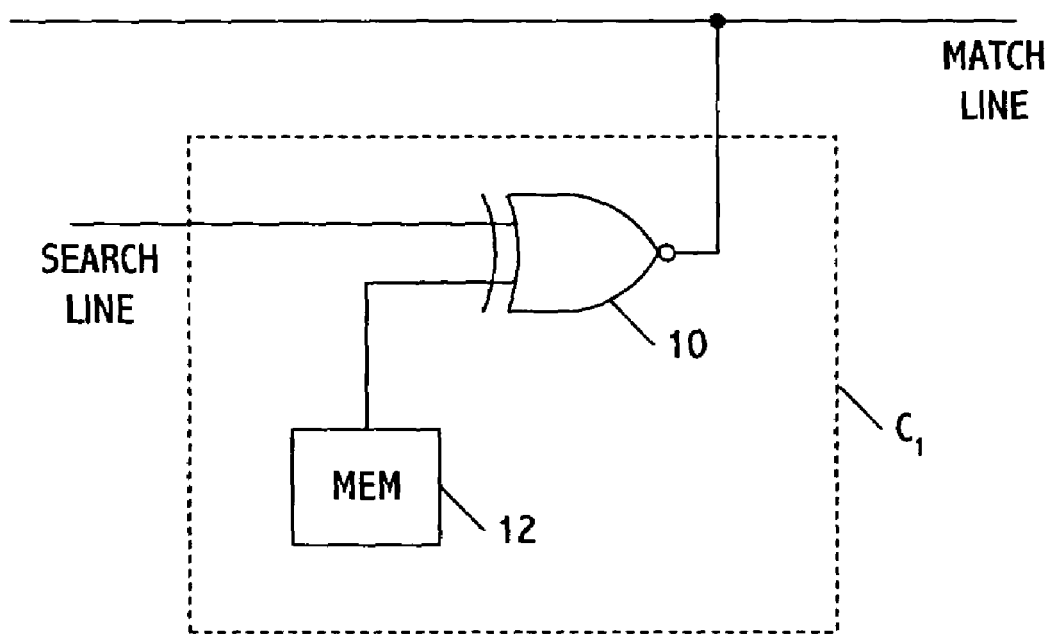
FIG. 2B shows an equivalent circuit diagram of each of the CAM cells.

FIG. 2B shows an equivalent diagram of each CAM cell, where an XOR gate 10 compares the data in storage circuit 12 and a value based on a combination of search line values. The output of gate 10 changes the state of the match line if no match exists.

Figure 3:
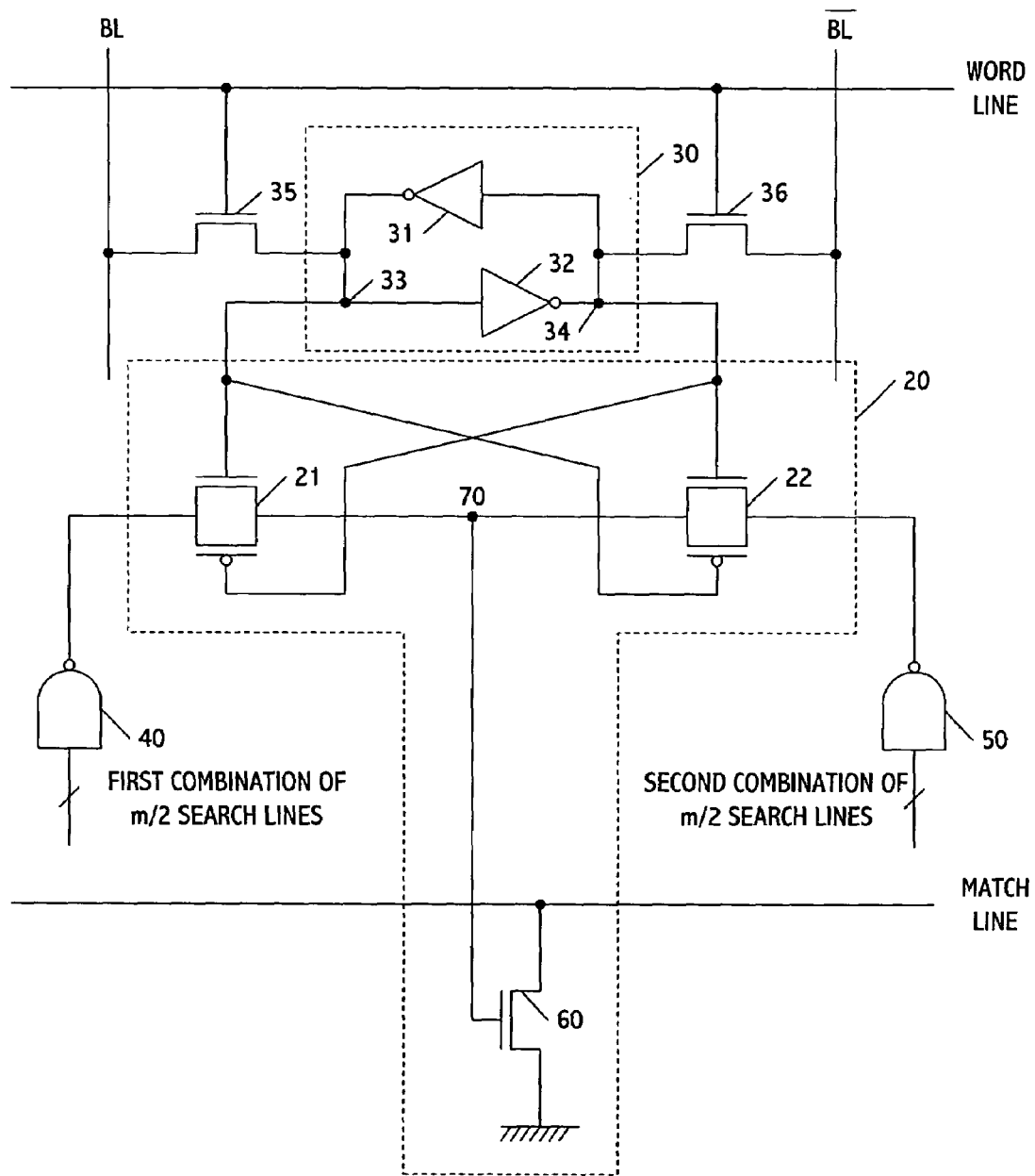
FIG. 3 is a diagram showing a more specific example of the internal structure of each of CAM cell in the circuit of FIG. 1.

FIG. 3 shows a more detailed diagram of a preferred internal structure of each CAM cell in the array. The cell includes a comparator 20 and a storage circuit 30. The storage circuit includes two cross-coupled inverters 31 and 32 that form a keeper for storing logical values at nodes 33 and 34. These nodes are coupled to a differential pair of bit lines BL and $\overline{BL}$ through transistors 35 and 36. The inverters may be any type including ones made from NMOS, PMOS, or CMOS with active or passive loads.

Transistor 35 may be an NMOS transistor having its source (drain) coupled to node 33 and its drain (source) coupled to bit line BL. Transistor 36 also may be an NMOS transistor having its source (drain) coupled to node 34 and its drain (source) coupled to complemetary bit line $\overline{BL}$. The gates of these transistors are coupled to a word line, so that when a word line is selected by the address decoder (e.g., pulled to a high logic state) transistors 35 and 36 are enabled to transfer data between node 33 and BL and node 34 and $\overline{BL}$ respectively. That is, the storage circuit of the cell stores a voltage corresponding to a logical 0 or 1 when the word line is selected.

The comparator includes a cross-connection of transmission gates 21 and 22. In this example, the gates are connected to perform a logic function (e.g., an XNOR operation), where node 34 generates the complement of node 33 and the output of logic 50 is the complement of logic 40. The pass characteristics of the transmission gates are controlled by the voltages at nodes 33 and 34. When the transmission gates are activated, they pass respective values output from logic gates 40 and 50. The value output from gate 40 is based on a logical combination of the values on one half (m/2) of the search lines and the value output from gate 50 is based on a logical combination of the values on the other half of the search lines. Gates 40 and 50 are shown as NAND gates but other logical circuits may alternatively be used. Also, gates 21 and 22 may be connected to perform other logic operations, e.g., NAND, NOR, XOR, etc.

Circuit 20 performs the function of comparing the logical values output from gates 40 and 50 to the values stored at the opposing nodes in circuit 30. If no match exists, a voltage is applied to the gate of transistor 60 to pull the state of the match line towards a reference potential, e.g., ground. If a match exists, no voltage is applied to the gate. This voltage signal is generated from node 70 of the comparator circuit. While the FIG. 3 embodiment is preferable, other circuit configurations may be used to form the comparator and storage portions of the CAM cell. In view of the foregoing, it is therefore clear that the CAM cell is a memory cell which includes compare circuitry embedded in it. This advantageously allows all entries to be compared at the same time.

Figure 4:
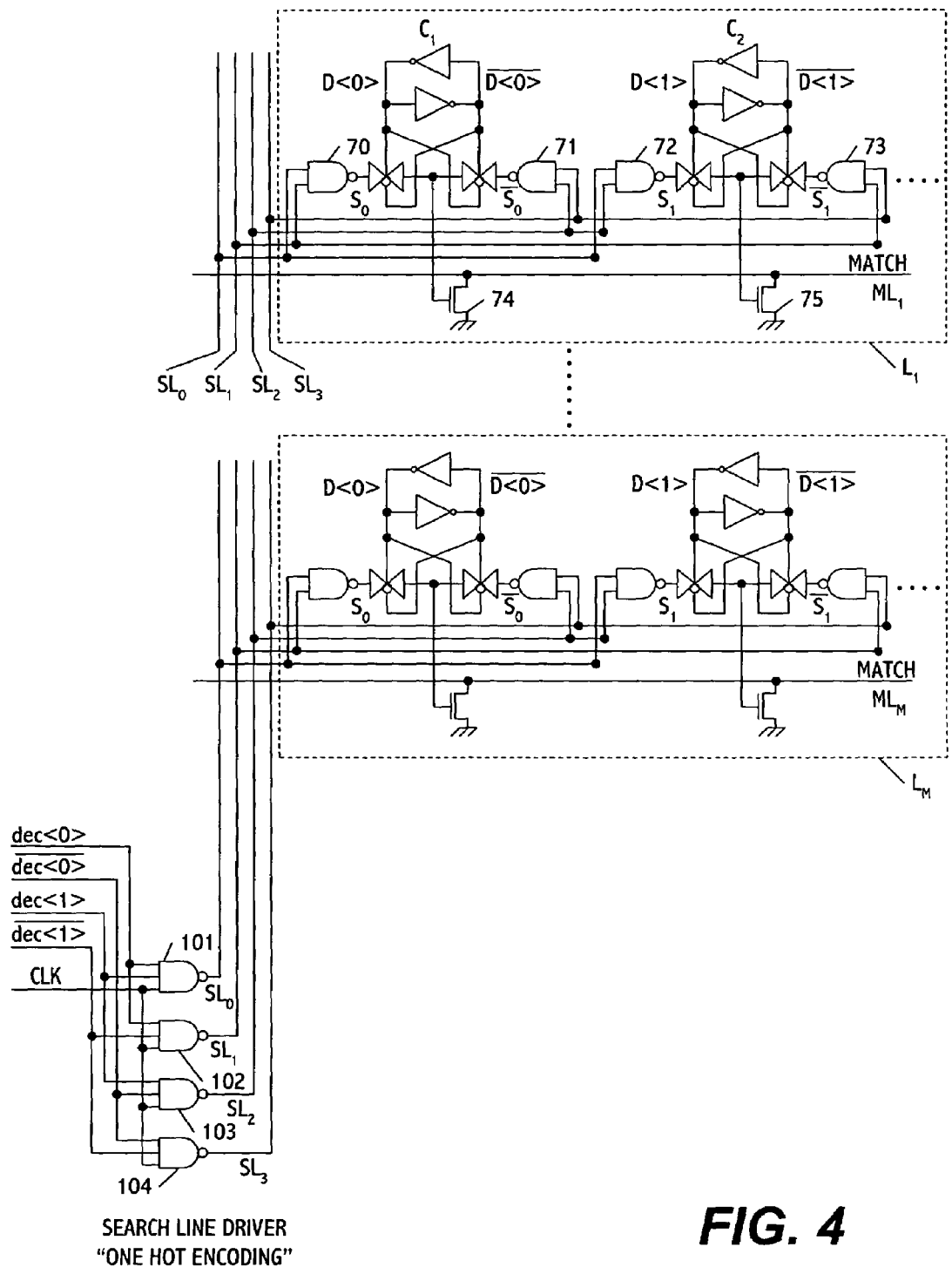
FIG. 4 is a diagram showing signals generated by a search line driver for searching a CAM array such as shown in FIG. 1 based on an input data value.
Figure 5:
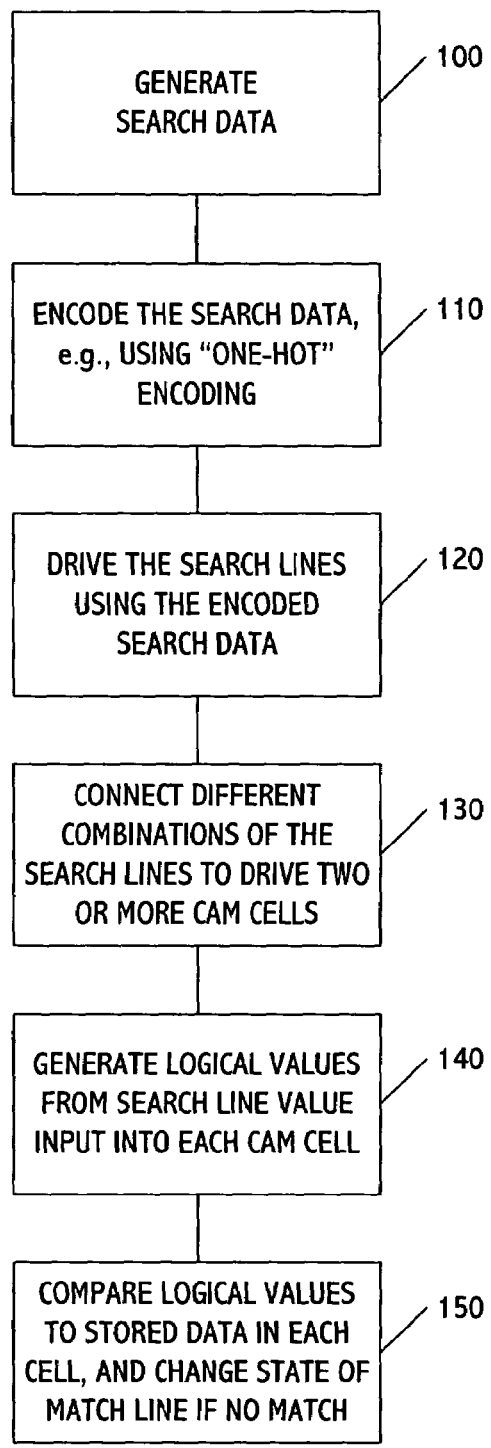
FIG. 5 is a flow diagram showing functional blocks included in a method for controlling a content addressable memory in accordance with one embodiment of the present invention.

FIG. 4 shows how search line driver 2 generates signals for driving cells having a structure such as shown in FIG. 3. The operation of this circuit is simultaneously described with reference to FIG. 5, which shows functional blocks included a method for controlling a content addressable memory in accordance with a preferred embodiment of the present invention.

Initially, search data is generated which, in this example, includes differential bit signals dec0, $\overline{dec0}$, dec1, and $\overline{dec1}$. (Block 100). The search data may be received from any one of a variety of sources depending on the particular application.

The search data is input into the search line driver, which in this embodiment encodes the differential bit signals using a "one-hot" encoding scheme, e.g., at any given time only one of the bit signals assumes a binary logic value different from the others. (Block 110). The line driver is preferably formed from a combination of logic circuits such as the series of NAND gates shown in FIG. 4, however other logic arrangements may be alternatively be used. Also, while one-hot encoding may prove to be beneficial for some applications, other encoding schemes may be used.

In order to implement the one-hot encoding scheme, predetermined combinations of the differential bit signals are input into the NAND gates along with clock signal clk. For example, bit signals dec0 and dec1 are input into gate 101, dec0 and $\overline{dec1}$ are input into gate 102, $\overline{dec0}$ and dec1 are input into gate 103, and $\overline{dec0}$ and $\overline{dec1}$ are input into gate 104. In alternative embodiments, different combinations of bit signals may be input into the NAND gates.

The values generated by the NAND gates are output on respective search lines $SL_0$–$SL_3$ in cycle times determined by clk. (Block 120). The search line driver may therefore be said to be a synchronous circuit, however if preferred an asynchronous line driver may be alternatively be used. One example of how the on-hot encoding scheme may be synchronously implemented in accordance with the present embodiment is shown in Table 1.

TABLE 1

| clk | dec<0> | $\overline{dec<0>}$ | dec<1> | $\overline{dec<1>}$ | SL<0> | SL<1> | SL<2> | SL<3> |
|---|---|---|---|---|---|---|---|---|
| 0 | X | X | X | X | 1 | 1 | 1 | 1 |
| 1 | 0 | 1 | 0 | 1 | 1 | 1 | 1 | 0 |
| 1 | 0 | 1 | 1 | 0 | 1 | 1 | 0 | 1 |
| 1 | 1 | 0 | 0 | 1 | 1 | 0 | 1 | 1 |
| 1 | 1 | 0 | 1 | 0 | 0 | 1 | 1 | 1 |

The search lines are connected to drive multiple CAM cells using different combinations of the same signals output from search line driver, e.g., different combinations of the same encoded (Block 130). In the present embodiment, different combinations of search lines $SL_0$–$SL_3$ are connected to adjacent pairs of CAM cells in each memory location, e.g., pairs of adjacent bits of each data word are driven by different combinations of the signals output from the search line driver.

More specifically, as shown in FIG. 4 the first memory location $L_1$ in the CAM array includes at least cells $C_1$ and $C_2$ corresponding to the first and second bit positions respectively of a stored word. In cell $C_1$, search lines $SL_0$ and $SL_1$ are connected to NAND gate 70 and search lines $SL_2$ and $SL_3$ are connected to NAND gate 71. A different combination of search lines is connected to cell $C_2$, e.g., search lines $SL_0$ and $SL_2$ are connected to NAND gate 72 and search lines $SL_1$ and $SL_3$ are connected to NAND gate 73. The NAND gates output logical values based on their input search line values. (Block 140). Each pair of adjacent CAM cells are therefore driven by different combinations of the same search line driver values.

An example of the search line driver values input into cells $C_1$ and $C_2$ and the corresponding values $S_0$, $\overline{S_0}$, $S_1$, and $\overline{S_1}$ generated from NAND gates 70–73 based on these values is set shown in Table 2.

TABLE 2

| SL<0> | SL<1> | SL<2> | SL<3> | S0 | $\overline{S0}$ | S1 | $\overline{S1}$ |
|---|---|---|---|---|---|---|---|
| 1 | 1 | 1 | 1 | 0 | 0 | 0 | 0 |
| 1 | 1 | 1 | 0 | 0 | 1 | 0 | 1 |
| 1 | 1 | 0 | 1 | 0 | 1 | 1 | 0 |
| 1 | 0 | 1 | 1 | 1 | 0 | 0 | 1 |
| 0 | 1 | 1 | 1 | 1 | 0 | 1 | 0 |

In cell $C_1$, the comparison circuit compares the values of $S_0$ and $\overline{S_0}$ to the data values stored in respective nodes $D_0$ and $\overline{D_0}$. If a match exists, a gate signal is applied to transistor 74 to pull the match line $ML_1$ to a different (e.g., low) voltage state if no match exists. If a match exists, no signal is applied to the gate of transistor 74. Similarly, in cell $C_2$, the values of $S_1$ and $\overline{S_1}$ are compared to the data values stored in respective nodes $D_1$ and $\overline{D_1}$, and a gate signal is applied to transistor 75 to control the state of match line $ML_1$ depending on the outcome of the comparison. (Block 150).

A similar connection of search lines containing the values in Table 2 may be used for the cells in the remaining memory locations in the CAM cell array. (FIG. 4 shows only a partial view of the CAM cell array, e.g., bit lines and other features included and/or connected to the CAM cells shown in FIGS. 1–3 have been omitted for clarity from FIG. 4 for clarity. Also, a shorthand notation is used to represent the transmission gates in each of cells $C_1$ and $C_2$).

In the foregoing embodiment, different combinations of the same search driver line values are described as driving pairs of CAM cells in each stored word. In alternative embodiments, three or more cells may be driven by different combinations of the same search driver lines. In these alternative embodiments, the values on six or more search driver lines may be one-hot encoded to drive the cells.

Using the one-hot encoding schemes of the foregoing embodiments produce a substantial reduction in power consumption compared with other content addressable memories which have been proposed. These other memories tend to have a very heavily loaded interconnect schemes where up to 30% of the overall power of the CAM is used to control the values on the search lines. This is because a one-to-one correspondence exists between the pairs of differential values output from the search line driver and the cells in the CAM array in these other memories.

The foregoing embodiments improve on this performance by toggling the values of a reduced number (e.g., only one) of its search lines every clock cycle. By minimizing the toggling scheme, a much more power efficient circuit may be realized for driving the content addressable memory. Also, the delay penalties associated with encoding and decoding may be kept to a minimum. Further, the foregoing embodiment is able to reduce the amount of switching required for the interconnects in the CAM array. This translates into a substantial reduction in noise in the CAM, which in turn minimizes errors.

In this application, the search data may include data that is to be retrieved from a random access or other form of memory connected to the CAM. For example, the search data may be a virtual page number or a virtual address. This scenario is found in a TLB, where the CAM translates the virtual page number to a physical address from a page table. The physical address points to data in a RAM. In this application, the match therefore actually becomes the physical address of the RAM. Other examples and applications are possible.

Figure 6:
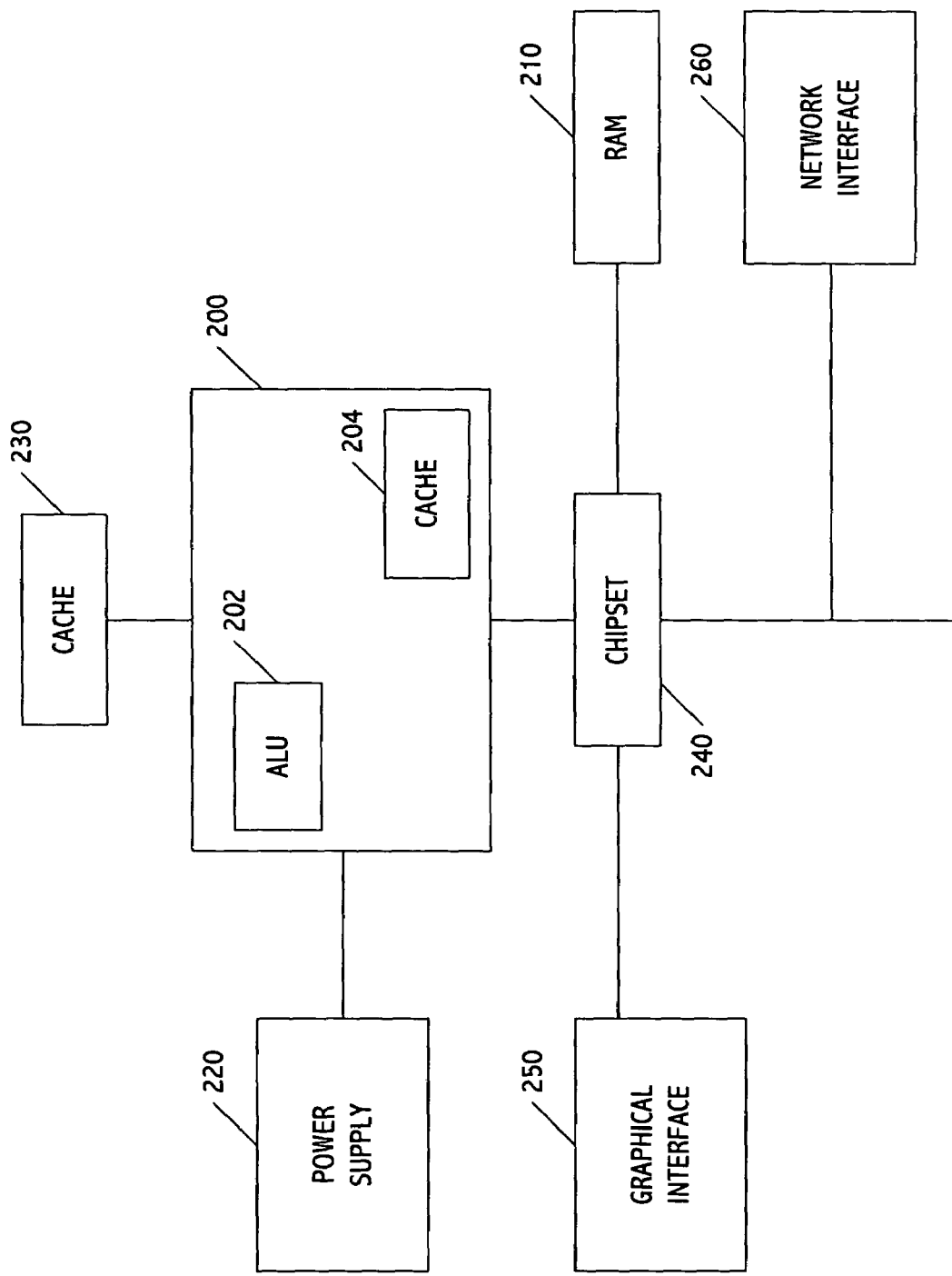
FIG. 6 is a diagram showing a system which may include a content addressable memory and an associated search line driver in accordance with any of the embodiments of the present invention.

FIG. 6 shows a system which includes a processor 200 and a memory 210. The processor may include an internal arithmetic logic unit 202 and cache 204, and the memory may be a random access memory or any other type of memory capable of storing data generated, processed, or otherwise controlled by or transferred through the processor. The processor and preferably the memory receive power from supply 220. The system may also include an external memory (e.g., cache) 230, a chipset 240, a graphical interface 250, and a network interface 260. These features are considered to be optional in the system. Also, all or a portion of the blocks in FIG. 6 may be incorporated onto a single chip die.

Any one of the foregoing embodiments of the content addressable memory circuit of the present invention may be included, on- or off-chip, for inputting signals into the blocks of FIG. 6. For example, the foregoing embodiments may be used to perform addressing in the external or internal caches or memory (e.g., RAM). In other cases, the foregoing embodiments may be included in a look-up table used, for example, in an Internet router. In this application, the routers forward data packets to an incoming port using an address look-up table which may be searched in accordance with any one or more of the embodiments of the present invention.

Any reference in this specification to an "embodiment" means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Furthermore, for ease of understanding, certain functional blocks may have been delineated as separate blocks; however, these separately delineated blocks should not necessarily be construed as being in the order in which they are discussed or otherwise presented herein. For example, some blocks may be able to be performed in an alternative ordering, simultaneously, etc.

Although the present invention has been described herein with reference to a number of illustrative embodiments, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A circuit, comprising:
   a content addressable memory; and
   a driver to generate a plurality of search line values,
   wherein different combinations of the values are input into two or more cells of the content addressable memory, and the driver synchronously generates the values based on a clock signal and changes less than half the values during each cycle of the clock signal.

2. The circuit of claim 1, wherein the two or more cells correspond to consecutive bit positions of a word stored in the content addressable memory.

3. The circuit of claim 1, wherein the driver changes only one of the values during each cycle of the clock signal.

4. The circuit of claim 1, wherein the driver encodes input search data using a one-hot encoding scheme, and wherein the encoded search data at least partially corresponds to the values.

5. The circuit of claim 1, wherein more than half of the search line values input into each of the two or more cells have a same logical value.

6. The circuit of claim 1, wherein only one of the search line values input into each of the two or more cells has a different logical value.

7. The circuit of claim 1, wherein the different combinations of search line values are simultaneously input into two or more of the cells of the content addressable memory.

8. A circuit comprising:
   a content addressable memory; and
   a driver to aenerate a plurality of search line values,
   wherein different combinations of the values are input into two or more cells of the content addressable memory, and wherein each of the two or more cells includes:
   a storage circuit to store data;
   a converter to convert one of the combinations of values into compare data; and
   a comparator to compare the stored and compare data and generate a signal to change a state of a match line when the stored and compare data do not match.

9. A driver circuit, comprising:
   an encoder to encode search data into logical values; and
   a plurality of signal lines to input different combinations of the logical values into two or more cells of a content addressable memory, wherein the encoder synchronously encodes the search data based on a clock signal and changes less than half the logical values during each cycle of the clock signal.

10. The driver of claim 9, wherein the two or more cells correspond to consecutive bit positions of a word stored in the content addressable memory.

11. The driver circuit of claim 9, wherein the encoder changes only one of the logical values during each cycle of the clock signal.

12. The driver circuit of claim 9, wherein the encoder encodes input search data using a one-hot encoding scheme.

13. The driver circuit of claim 9, wherein more than half of the logical values on the search lines have a same value.

14. The driver circuit of claim 9, wherein only one of the logical values has a different value.

15. A method for searching a content addressable memory, comprising:
    encoding search data into a plurality of logical values; and
    inputting different combinations of logical values into two or more cells of the content addressable memory, wherein the search data is synchronously encoded based on a clock signal and wherein encoding the search data includes changing less than half the logical values during each cycle of the clock signal.

16. The method of claim 15, wherein the two or more cells correspond to consecutive bit positions of a word stored in the content addressable memory.

17. The method of claim 15, further comprising:
    generating compare data from each combination of logical values; and
    comparing the compare data generated from each combination of logical values to data stored in respective ones of the two or more cells.

18. The method of claim 17, wherein the compare data are complementary values.

19. The method of claim 17, further comprising:
    changing a state of a match line if the compare and stored data are different.

20. The method of claim 15, wherein encoding the search data includes: changing only one of the logical values during each cycle of the clock signal.

21. The method of claim 15, wherein encoding the search data is performed based on a one-hot encoding scheme.

22. The method of claim 15, wherein more than half of the logical values have a same value.

23. A system, comprising:
    a circuit; and
    a content addressable memory; and
    a driver to generate a plurality of search line values, wherein different combinations of the values are input into cells of the content addressable memory and wherein the content addressable memory outputs a match value for input into the circuit and the driver synchronously generates the values based on a clock signal and changes less than half the values during each cycle of the clock signal.

24. The system of claim 23, wherein circuit is one of another memory, a processor, a chipset, and an interface.

* * * * *